United States Patent [19]
Lee

[11] Patent Number: 6,051,476
[45] Date of Patent: *Apr. 18, 2000

[54] METHOD FOR MANUFACTURING CAPACITOR OF SEMICONDUCTOR MEMORY DEVICE

[75] Inventor: Soo Man Lee, Kyoungki-do, Rep. of Korea

[73] Assignee: Dongbu Electronics Co., Ltd., Seoul, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/349,053

[22] Filed: Jul. 7, 1999

[30] Foreign Application Priority Data

Oct. 11, 1996 [JP] Japan ...................................... 8269743

[51] Int. Cl.$^7$ .................................................. H01L 21/29
[52] U.S. Cl. ........................ 438/398; 438/665; 438/964; 438/255; 430/395
[58] Field of Search ...................... 438/255, 398, 438/665, 964, FOR 220; 430/325, 326, 395

[56] References Cited

U.S. PATENT DOCUMENTS

| | | |
|---|---|---|
| 5,438,011 | 8/1995 | Blalock et al. . |
| 5,753,419 | 5/1998 | Misium . |
| 5,837,581 | 11/1998 | Cheng . |
| 5,858,852 | 1/1999 | Aiso et al. . |
| 5,981,337 | 11/1999 | Chuang . |

*Primary Examiner*—George Fourson
*Assistant Examiner*—Joanne A. Garcia
*Attorney, Agent, or Firm*—Andrus, Sceales, Starke & Sawall

[57] ABSTRACT

Disclosed is a method to reduce step difference of a cell region and a peripheral region, and to increase the capacitance. A first intermetal insulating layer, a planarization layer and a second intermetal insulating layer are formed successively on the semiconductor layer including a storage node. A contact hole is formed by etching the first intermetal insulating layer, the planarization layer and the second intermetal insulating layer so that a selected portion of the storage node is exposed. A photoresist pattern in which a wave of saw-teeth shape is formed at sidewalls, is formed on the second intermetal insulating layer so as to fill the contact hole. Spacers are formed at both sidewalls of the photoresist pattern in which the wave of saw-teeth shape is formed. Herein, a wave of saw-teeth shape is formed at inner surfaces of the spacer owing to both sidewalls of the photoresist pattern. The photoresist pattern in which the waves of saw-teeth shape are formed at sidewalls thereof, is removed. A storage node electrode is formed by filling inside of the contact hole and between the spacers with a doped polysilicon layer. Herein, a wave of saw-teeth shape is formed at sidewalls of the storage node electrode owing to the spacer. The spacer and the second intermetal insulating layer are removed, and a dielectric layer and a plate electrode are formed on a surface of the storage node electrode successively thereby forming a capacitor.

11 Claims, 7 Drawing Sheets

METHOD FOR MANUFACTURING CAPACITOR OF SEMICONDUCTOR MEMORY DEVICE

BACKGROUND OF THE INVENTION

1. Field of the Invention

This invention generally relates to a method for manufacturing a capacitor of semiconductor memory device, more particularly to a method for manufacturing a capacitor of semiconductor memory device capable of increasing surface area of a storage node electrode of a capacitor.

2. Description of the Related Art

As the integrity of memory device increases, cell dimension and gap between cells decrease. However, currently it is still required a capacitor having large capacitance and also occupying smaller dimension since the capacitor should hold a regular degree of capacitance.

Conventionally, a cylinder type storage electrode occupying smaller dimension and large capacitance has been widely used.

FIGS. 3A to 3D illustrate manufacturing process of a conventional cylinder type capacitor.

Referring to FIG. 3A, a planarization layer 302 is formed on a semiconductor substrate 300 in which a transistor(not shown) and a storage node 301 are formed. An oxide layer of intermetal insulating layer 304 is formed on the planarization layer 302. The intermetal insulating layer 304 and the planarization layer 302 are etched to expose a storage node 301 so that a storage node contact hole H is formed.

Referring to FIG. 3B, a first polysilicon layer 306 for storage node electrode is formed on the intermetal insulating layer 304 to be contacted with the exposed storage node 301. A sacrifice oxide layer 308 has a planarization property and is made of a layer having excellent wet-etching selectivity ratio to the polysilicon layer, such as a PSG layer. the sacrifice oxide layer 308 and the first polysilicon layer 306 are patterned by selected portions thereof such that they are remained within the storage node contact hole H.

Referring to FIG. 3C, a second polysilicon layer for storage node electrode is formed on the intermetal insulating layer 304 and on the sacrifice layer 308. Then this, the second polysilicon layer is blanket-etched to expose those surfaces of the sacrifice oxide layer 108 and the second intermetal layer 304 thereby forming a polysilicon-spacer 310 at a sidewall of the sacrifice oxide layer 308. Consequently, a storage node electrode 312 comprising the first polysilicon layer 306 and the polysilicon-spacer 310 is formed.

As shown in FIG. 3D, the sacrifice oxide layer 308 is removed by the wet-etching process. Afterward, a dielectric layer 314 is coated on the surface of storage node electrode 312 and on the second intermetal insulating layer 304. As for the dielectric layer 314, for example, an Oxide-Nitride-Oxide(ONO) and a Nitride-Oxide(NO) can be used. Next, a plate electrode 316 is formed on the surface of the dielectric layer 314 thereby accomplishing the cylinder type capacitor.

However, the above cylinder type capacitor is increased as much as the height of spacer. At this time, the step difference of a cell region in which a capacitor is formed and a peripheral region is increased when the height of spacer is increased so as to increase the capacitance. As a result, it is very difficult to align a mask for forming a photoresist pattern precisely and it is also difficult to obtain sufficient process margin during a subsequent photolithography process.

Accordingly, in view of the occurrence of step difference in the cell region and the peripheral region, the cylinder type capacitor has a limitation of the increase in the capacitance. Therefore, the conventional cylinder type capacitor is not suitable for the semiconductor device which requires high integrity.

SUMMARY OF THE INVENTION

Accordingly, it is the object of the present invention to reduce step difference of the cell region and the peripheral region and to increase the capacitance simultaneously.

To accomplish the foregoing object, one embodiment of this invention is constituted as follows.

A first intermetal insulating layer, a planarization layer and a second intermetal insulating layer are formed successively on the semiconductor layer including a storage node. A contact hole is formed by etching the first intermetal insulating layer, the planarization layer and the second intermetal insulating layer so that a selected portion of the storage node is exposed. A photoresist pattern in which a wave of saw-teeth shape is formed at sidewalls, is formed on the second intermetal insulating layer so as to fill the contact hole. Spacers are formed at both sidewalls of the photoresist pattern in which the wave of saw-teeth shape is formed. Herein, a wave of saw-teeth shape is formed at inner surfaces of the spacer owing to both sidewalls of the photoresist pattern. The photoresist pattern in which the waves of saw-teeth shape are formed at sidewalls thereof, is removed. A storage node electrode is formed by filling inside of the contact hole and between the spacers with a doped polysilicon layer. Herein, a wave of saw-teeth shape is formed at sidewalls of the storage node electrode owing to the spacer. The spacer and the second intermetal insulating layer are removed, and a dielectric layer and a plate electrode are formed on a surface of the storage node electrode successively thereby forming a capacitor.

Another embodiment of this invention is constituted as follows.

A first intermetal insulating layer, a planarization layer and a second intermetal insulating layer are formed successively on the semiconductor layer including a storage node. A contact hole is formed by etching the first intermetal insulating layer, the planarization layer and the second intermetal insulating layer so that a selected portion of the storage node is exposed. A photoresist pattern in which a wave of saw-teeth shape is formed at sidewalls, is formed on the second intermetal insulating layer so as to fill the contact hole. Spacers are formed at both sidewalls of the photoresist pattern in which the wave of saw-teeth shape is formed. Herein, a wave of saw-teeth shape is formed at inner surfaces of the spacer owing to both sidewalls of the photoresist pattern. The photoresist pattern in which the waves of saw-teeth shape are formed at sidewalls thereof, is removed. A storage node electrode is formed by filling inside of the contact hole and between the spacers with a doped polysilicon layer. Herein, a wave of saw-teeth shape is formed at sidewalls of the storage node electrode owing to the spacer. The spacer and the second intermetal insulating layer are removed. Afterward, at least one groove having a selected depth is formed in an upper portion of the storage node electrode, and a dielectric layer and a plate electrode are formed on a surface of the storage node electrode successively thereby forming a capacitor.

The surface area of the storage node electrode according to the present invention is increased thereby obtaining sufficient amount of capacitance without requiring of any increase in the storage electrode height of the capacitor.

Furthermore, the step difference of the cell region and the peripheral region is reduced in the present invention since the storage electrode height of the capacitor is lower than the conventional cylinder type semiconductor device. Accordingly, a mask can be aligned precisely and the process margin can be obtained sufficiently.

DETAILED DESCRIPTION OF THE PREFERRED EMBODIMENTS

Figure 1A:
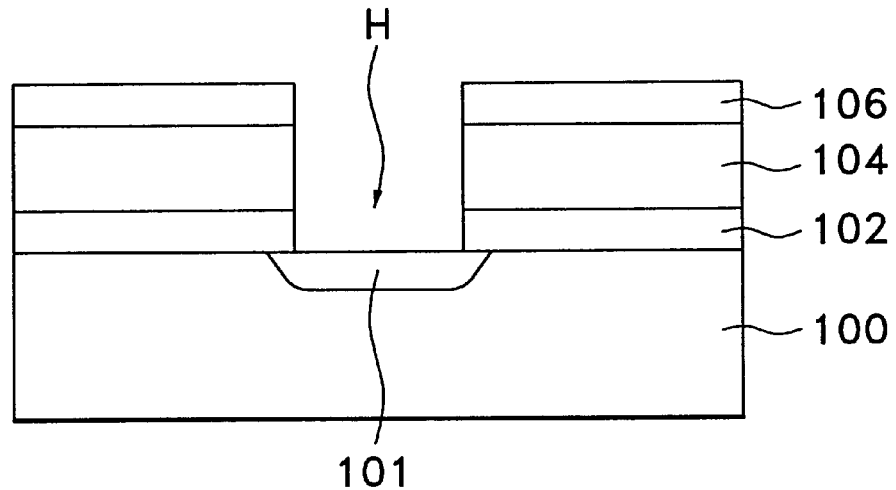
FIGS. 1A to 1F are cross-sectional views showing manufacturing process of a semiconductor memory device according to one embodiment of the present invention.

Referring to FIG. 1A, a first intermetal insulating layer 102, a planarization layer 104 and a second intermetal insulating layer 106 are successively formed on a semiconductor substrate 100 in which a transistor(not shown) and a storage node 101 are formed. Herein, as for those first and second intermetal insulating layers 102,106, a silicon oxide layer is used preferably. The planarization layer 104 has superior etching selectivity to the second intermetal insulating layer 106. The second intermetal insulating layer 106, the planarization layer 104 and a first intermetal insulating layer 102 are etched to expose a selected portion of the storage node 101 thereby forming a storage node contact hole H.

Figure 1B:
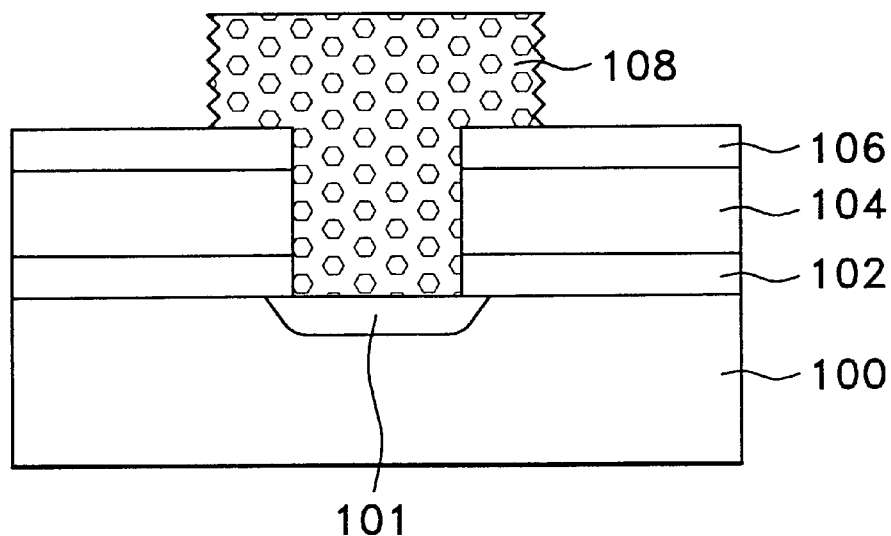

Referring to FIG. 1B, a photoresist layer is formed on the second intermetal insulating layer 106 so that the storage node contact hole H is filled sufficiently. The photoresist layer is exposed and developed to be remained in the contact hole H and its circumference region thereby forming a photoresist pattern 108. The photoresist pattern 108 is formed to have a wave of a saw-teeth shape at its sidewall.

The wave of a saw-teeth shape in the sidewall of the photoresist pattern 108 is obtained by the standing wave effect. Herein, the standing wave effect means a phenomenon, i.e. when the photoresist pattern 108 is exposed, light reflected from the second intermetal insulating layer 106 interferes with light radiated from a light source thereby making the sidewall of the exposed photoresist pattern 108 to have a wave shape. A photoresist material of high standing wave effect, for example, a material of high refractivity and transmittance are used preferably, and a deep UV(DUV) light source is used preferably for the light source.

Figure 1C:
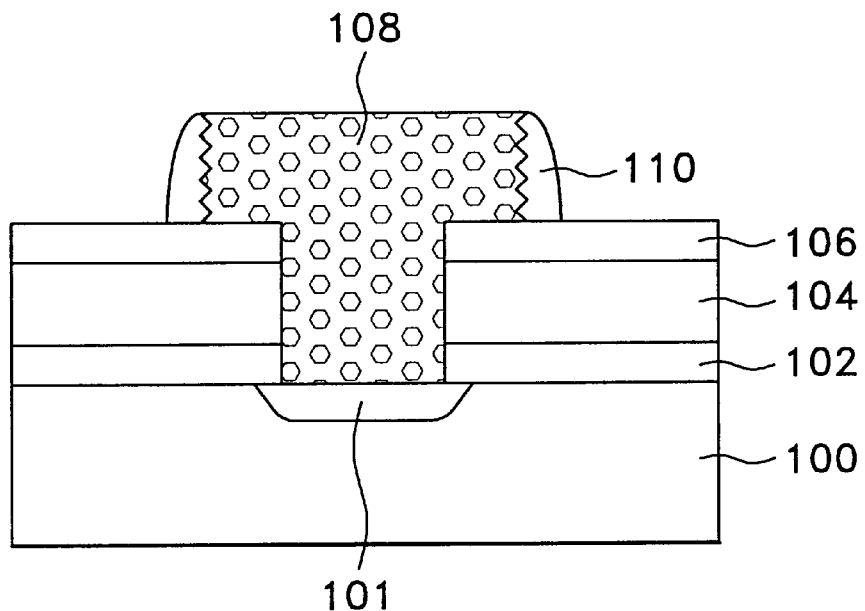

Next, as shown in FIG. 1C, an oxide layer for spacer is formed on the second intermetal insulating layer 106 so as to cover the photoresist pattern 108. The oxide layer for spacer is deposited according to a CVD process such as the PECVD or LPCVD process and it is preferable that the oxide layer has an equal etching selectivity ratio with the second intermetal insulating layer 106. A spacer 110 is formed at both sidewalls of the photoresist pattern 108 by blanket-etching the oxide layer for spacer. Herein, an inner sidewall of the spacer 110 has a wave of saw-teeth shape owing to the photoresist pattern 108 having a wave of saw-teeth shape.

Figure 1D:
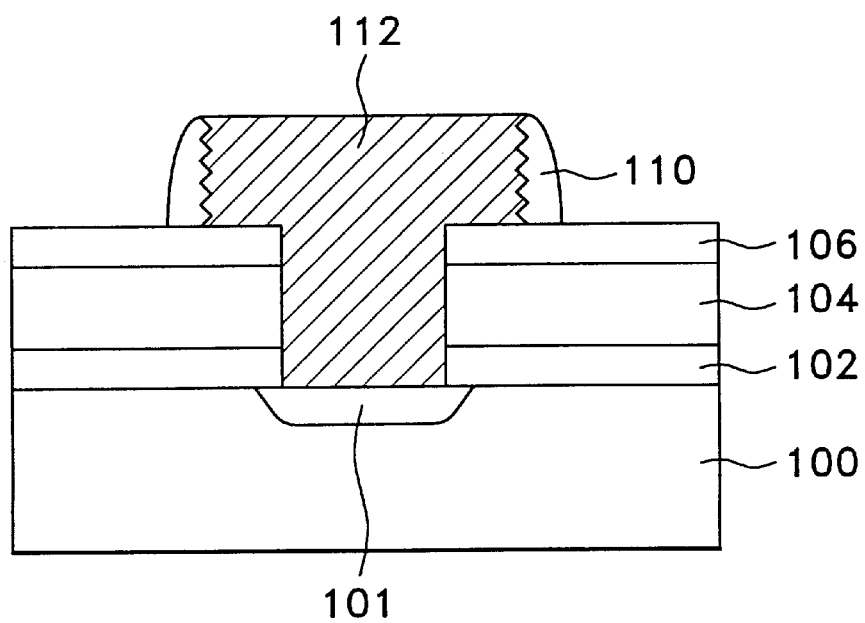

Referring to FIG. 1D, the photoresist pattern 108 is removed by a known method. A doped-polysilicon layer for storage electrode is formed on the second intermetal insulating layer 106 such that the contact hole and regions between the spacers 110 are filled sufficiently. Afterward, the doped-polysilicon layer for storage electrode is etched in an anisotropic manner so as to expose the upper portion of the spacer 110 and the surface of the second intermetal insulating layer 106. Therefore, the polysilicon layer for storage electrode is remained in the contact hole and between the spacers 110. Herein, the remained doped-polysilicon layer becomes a storage node electrode 112. Herein, both sidewalls of the storage node electrode 112 have the wave of saw-teeth shape owing to the wave of saw-teeth shape formed at the inner sidewall of the spacer 110. As a result, the wave of saw-teeth shape is also formed at sidewalls of the storage node electrode 112 thereby increasing the surface area of the storage electrode.

Figure 1E:
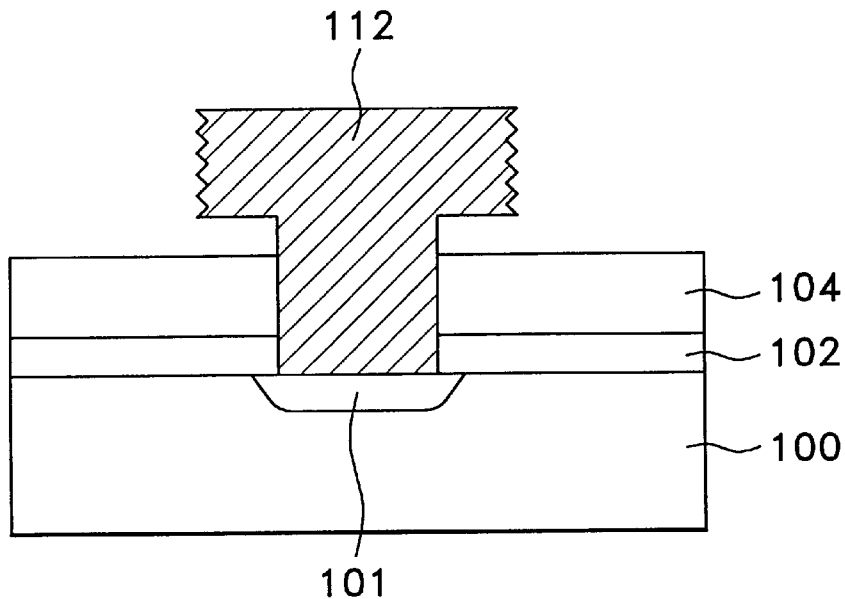
Figure 1F:
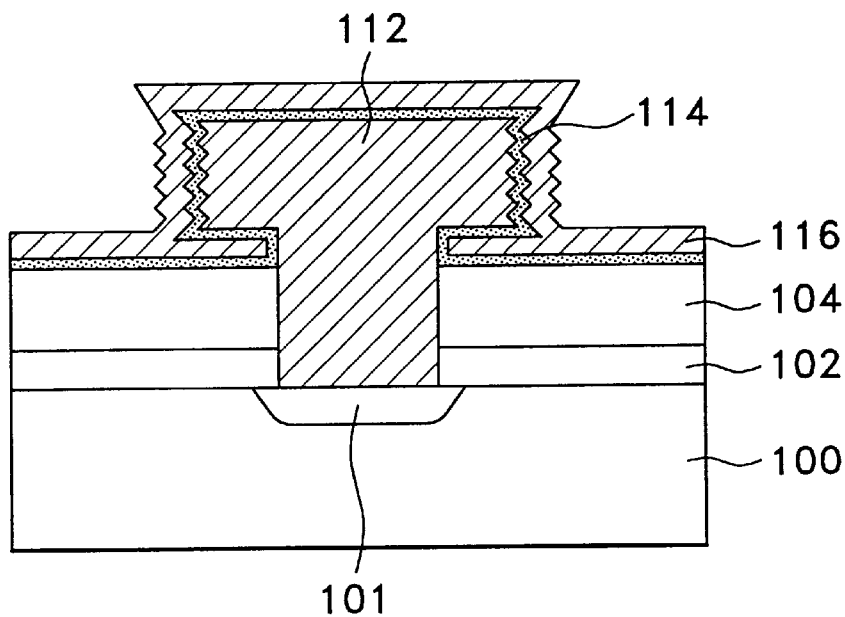

Next, as shown in FIG. 1E, the spacer 110 is removed by a known wet-etching process. During etching process of the spacer 110, a second intermetal insulating layer 106 having an equal etching selectivity ratio with the spacer 110 is removed simultaneously. As a result, the surface area of the storage node electrode 112 is increased as much as a portion that was contacted with the second intermetal insulating layer 106.

Afterward, as shown in FIG. 1D, a dielectric layer 114 is formed on the exposed planarization layer 104 and the storage node electrode 112. Herein, an ONO layer or an NO layer is used for the dielectric layer 114. A plate electrode 116 made of a polysilicon layer is formed on the dielectric layer 114.

According to the present embodiment, the storage node electrode of the capacitor is formed as stack type and its sidewalls have the wave of saw-teeth shape. Therefore, increase in the height of storage electrode is not required to obtain a sufficient amount of capacitance.

As a result, the step difference of a cell region and a peripheral region is reduced to the maximum value thereby realizing a precise alignment of during subsequent photolithography process and obtaining sufficient amount of process margin.

Figure 2A:
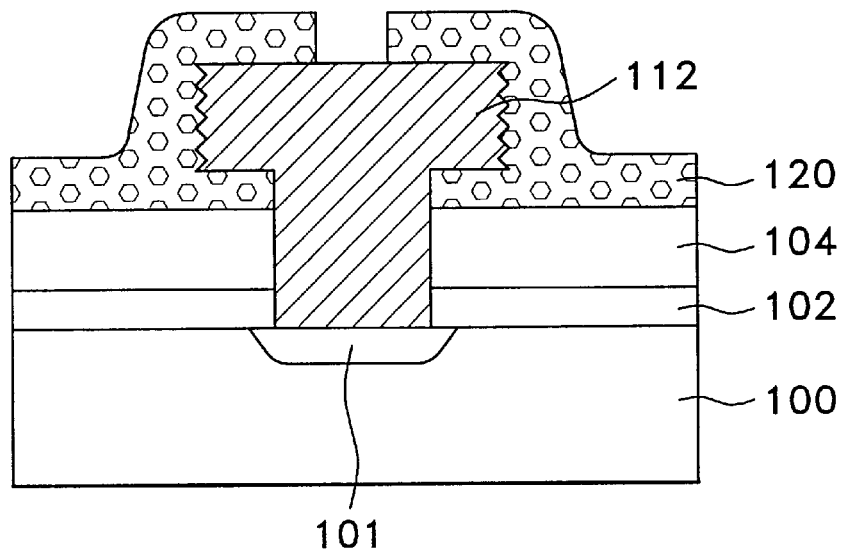
FIGS. 2A to 2C illustrate manufacturing process of a semiconductor memory device according to another embodiment of the present invention.
Figure 2B:
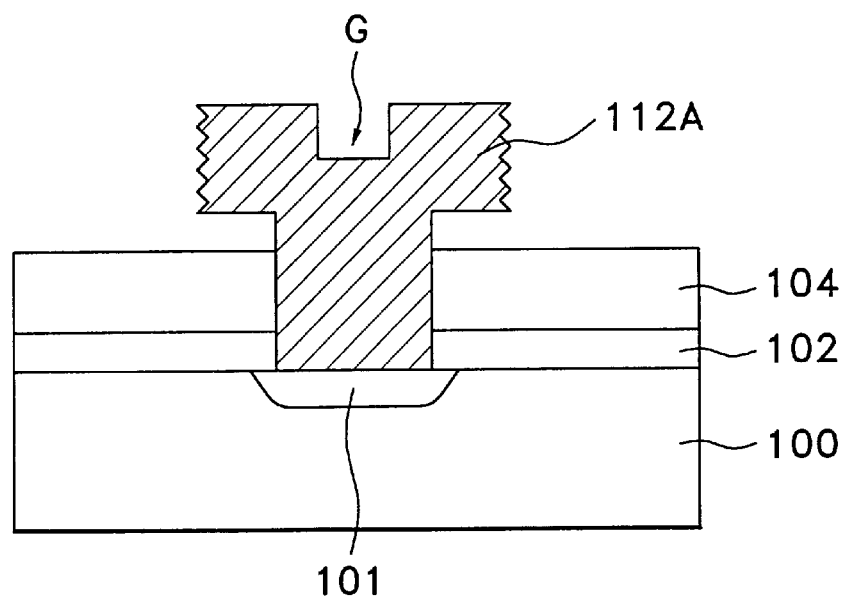
Figure 2C:
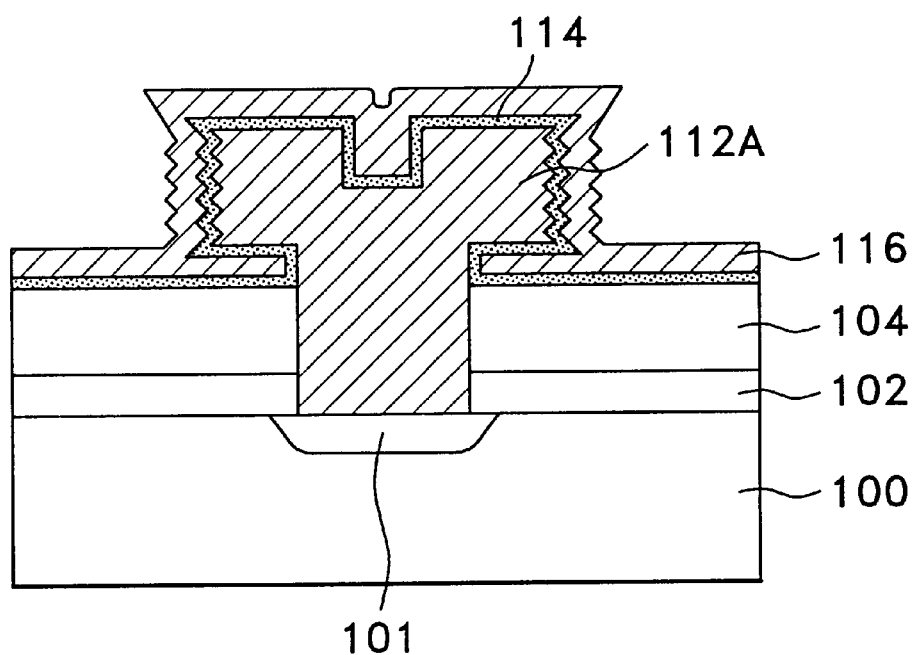
Figure 3A:
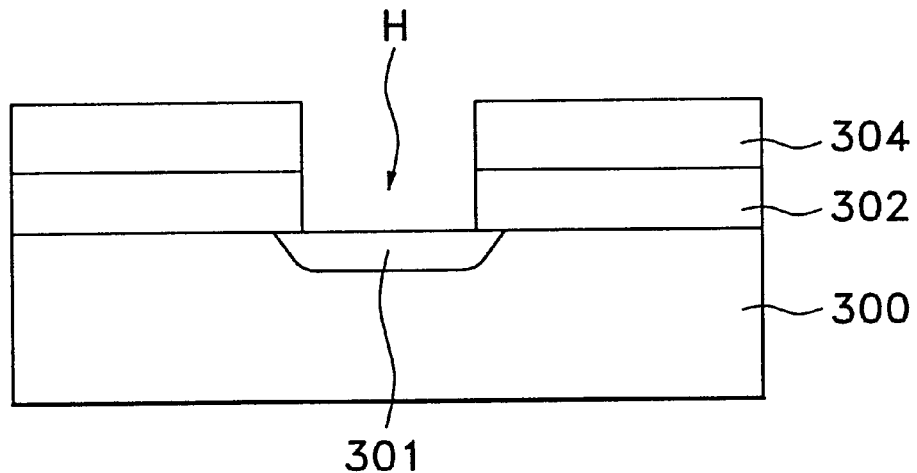
FIGS. 3A to 3D are cross-sectional views showing a manufacturing process of a conventional semiconductor memory device.
Figure 3B:
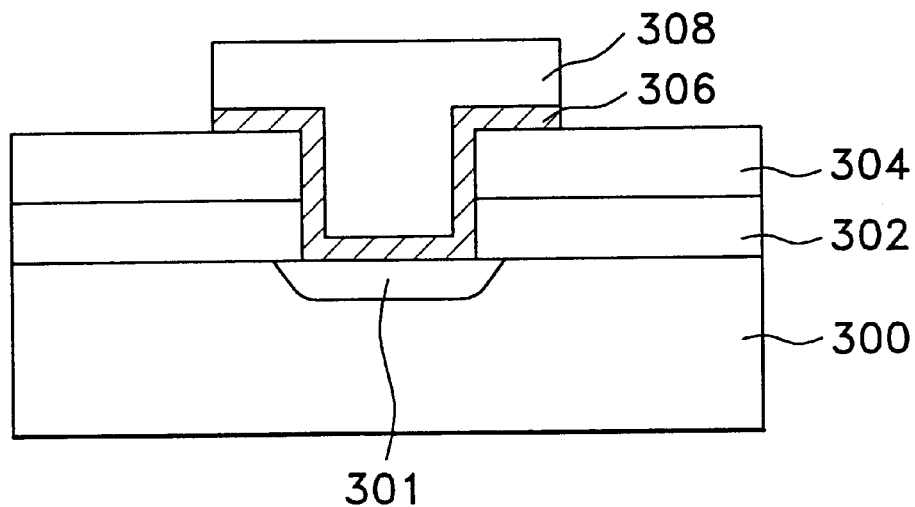
Figure 3C:
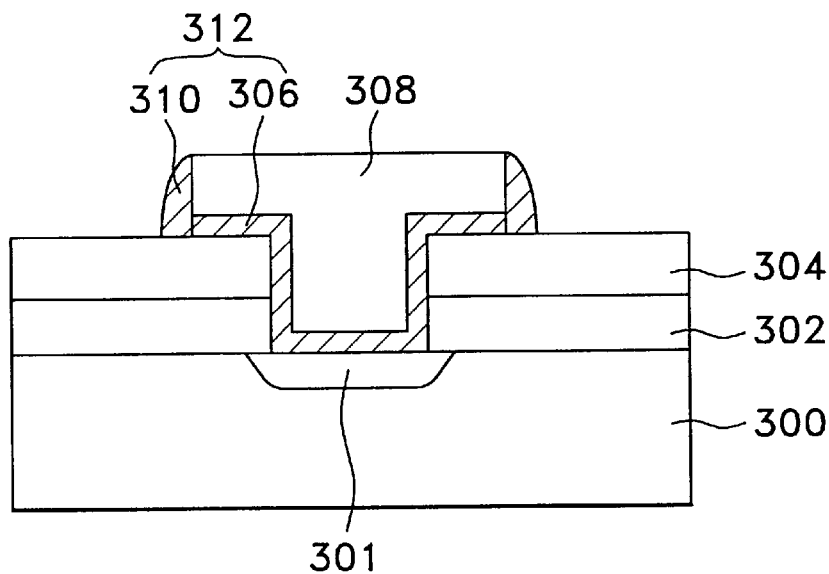
Figure 3D:
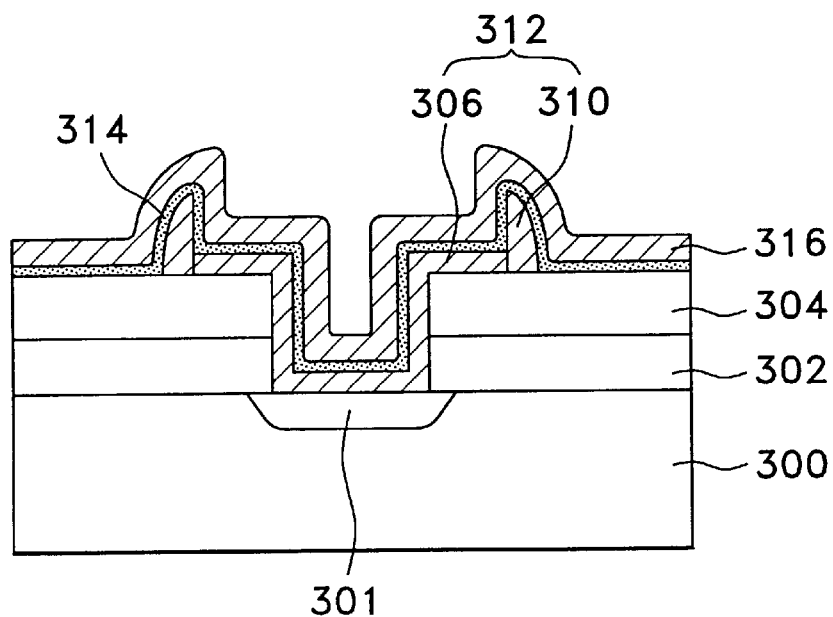

FIGS. 2A to 2C are drawings for illustrating another embodiment of the present invention.

First of all, a storage node electrode 112 equipped with a wave of saw-teeth shape at a sidewall thereof is formed according to the process as described in the previous embodiment.

Afterward, referring to FIG. 2A, a photoresist pattern 120 is formed according to a known photolithography process so that at least one portion on an upper portion of the storage node electrode 112 may be opened.

Referring to FIG. 2B, a selected portion of the exposed storage node electrode 112 is etched by using the photoresist pattern 120 as a mask thereby forming a storage node electrode 112A having at least one groove G. Herein, there is formed at least one groove G in the storage node electrode 112A, as a result the surface area thereof is increased as much as the inner surface of the groove G.

Afterward, as shown in FIG. 2C, a dielectric layer 114 is formed on the exposed planarization layer 104 and on the storage node electrode 112. Herein, as for the dielectric layer 114, the ONO layer or NO layer can be used similar to the previous embodiment. A plate electrode 116 made of doped-polysilicon layer is formed on the dielectric layer 114 thereby completing a capacitor.

Accordingly, since there is provided the wave at the sidewall of the storage node electrode and also formed at least one groove in the upper portion of the storage node electrode of the present embodiment, the present embodiment is different from the first embodiment in which the wave is provided to the sidewall of the storage node electrode. Consequently, within an equal dimension, the capacitor of the second embodiment can generate larger capacitance than the capacitor manufactured according to the first embodiment.

As described above in detail, according to the present invention, the storage node electrode is formed in a stack type and has a wave shape at its sidewall, or is formed in a stack type and has wave shape at its sidewall together with at least one groove in the upper portion of the storage node electrode.

As a result, surface area of the storage node electrode is increased thereby obtaining a sufficient amount of capacitance without requiring of any increase in the storage electrode height of the capacitor.

Furthermore, the step difference of the cell region and the peripheral region is reduced in the present invention since the electrode height of the capacitor is lower than the conventional cylinder type semiconductor device. Accordingly, a mask can be aligned precisely and the process margin can be obtained sufficiently.

Various other modifications will be apparent to and can be readily made by those skilled in the art without departing from the scope and spirit of the present invention.

What is claimed is:

1. A method for manufacturing capacitor of semiconductor memory device comprising the steps of:

providing a semiconductor substrate including a storage node;

forming a first intermetal insulating layer, a planarization layer and a second intermetal insulating layer on the semiconductor layer successively;

forming a contact hole by etching the first intermetal insulating layer, the planarization layer and the second intermetal insulating layer so that a selected portion of the storage node is exposed;

forming a photoresist pattern on the second intermetal insulating layer so as to fill the contact hole, wherein the photoresist pattern has a wave of saw-teeth shape at sidewalls thereof;

forming spacers at both sidewalls of the photoresist pattern in which the wave of saw-teeth shape is formed, wherein a wave of saw-teeth shape is formed at inner surfaces of the spacer owing to both sidewalls of the photoresist pattern;

removing the photoresist pattern in which the waves of saw-teeth shape are formed at sidewalls thereof;

forming a storage node electrode by filling inside of the contact hole and between the spacers with a doped polysilicon layer, wherein a wave of saw-teeth shape is formed at sidewalls of the storage node electrode owing to the spacer;

removing the spacer and the second intermetal insulating layer; and depositing a dielectric layer and a plate electrode on a surface of the storage node electrode successively.

2. The method of claim 1, wherein the step of forming the storage node electrode further comprises the steps of:

depositing the doped polysilicon layer so as to fill the contact hole and regions between spacers sufficiently; and anisotropic-etching surfaces of the spacer and the second intermetal insulating layer to be exposed.

3. The method of claim 1, wherein the planarization layer has superior etching selectivity ratio to the second intermetal insulating layer.

4. The method of claim 3, wherein a material constituting the spacer has the same etching selectivity ratio with the second intermetal insulating layer.

5. The method of claim 4, wherein the spacer and the second intermetal insulating layer are removed by a wet-etching process.

6. A method for manufacturing capacitor of semiconductor memory device comprising the steps of:

providing a semiconductor substrate including a storage node;

forming a first intermetal insulating layer, a planarization layer and a second intermetal insulating layer on the semiconductor layer successively;

forming a contact hole by etching the first intermetal insulating layer, the planarization layer and the second intermetal insulating layer so that a selected portion of the storage node is exposed;

forming a photoresist pattern on the second intermetal insulating layer so as to fill the contact hole, wherein the photoresist pattern has a wave of saw-teeth shape at sidewalls thereof;

forming spacers at both sidewalls of the photoresist pattern in which the wave of saw-teeth shape is formed, wherein a wave of saw-teeth shape is formed at inner surfaces of the spacer owing to both sidewalls of the photoresist pattern;

removing the photoresist pattern in which the waves of saw-teeth shape are formed at sidewalls thereof;

forming a storage node electrode by filling inside of the contact hole and between the spacers with a doped polysilicon layer, wherein a wave of saw-teeth shape is formed at sidewalls of the storage node electrode owing to the spacer;

removing the spacer and the second intermetal insulating layer;

forming at least one groove having a selected depth in an upper portion of the storage node electrode; and depositing a dielectric layer and a plate electrode on a surface of the storage node electrode successively.

7. The method of claim 6, wherein the step of forming the groove comprises the steps of:

forming a photoresist pattern on the semiconductor substrate in which the storage node electrode is formed, so as to expose a selected portion of the storage node electrode;

etching the storage node electrode to a selected depth by using the photoresist pattern as a mask; and removing the photoresist pattern.

8. The method of claim 6, wherein the step of forming the storage node electrode further comprises the steps of:

depositing the doped polysilicon layer so as to fill the contact hole and regions between spacers sufficiently; and anisotropic-etching surfaces of the spacer and the second intermetal insulating layer to be exposed.

9. The method of claim 6, wherein the planarization layer has superior etching selectivity ratio to the second intermetal insulating layer.

10. The method of claim 9, wherein a material constituting the spacer has the same etching selectivity ratio with the second intermetal insulating layer.

11. The method of claim 9, wherein the spacer and the second intermetal insulating layer are removed by a wet-etching process.

* * * * *

UNITED STATES PATENT AND TRADEMARK OFFICE
CERTIFICATE OF CORRECTION

PATENT NO.     : 6,051,476
DATED          : April 18, 2000
INVENTOR(S)    : Soo Man Lee It is certified that error appears in the above-identified patent and that said Letters Patent is hereby corrected as shown below:

Title Page:
Item [30] Foreign Application Priority Data:
Delete "Oct. 11, 1996 [JP] Japan 8269743" and substitute therefor -- July 10, 1998, Korea 98-27766--.

Signed and Sealed this

Seventeenth Day of July, 2001

Attest:

NICHOLAS P. GODICI
Attesting Officer    Acting Director of the United States Patent and Trademark Office